(12) United States Patent
Rizzo et al.

(10) Patent No.: US 7,158,407 B2
(45) Date of Patent: Jan. 2, 2007

(54) TRIPLE PULSE METHOD FOR MRAM TOGGLE BIT CHARACTERIZATION

(75) Inventors: Nicholas D. Rizzo, Gilbert, AZ (US); Mark F. Deherrera, Chandler, AZ (US); Jason A. Janesky, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 11/118,145

(22) Filed: Apr. 29, 2005

(65) Prior Publication Data

US 2006/0245242 A1    Nov. 2, 2006

(51) Int. Cl.
*G11C 11/15* (2006.01)
(52) U.S. Cl. ............... 365/173; 365/158; 365/201; 365/236
(58) Field of Classification Search ................ 365/171, 365/173, 158, 201, 236
See application file for complete search history.

(56) References Cited

U.S. PATENT DOCUMENTS

| | | | | |
|---|---|---|---|---|
| 3,798,467 A | * | 3/1974 | Gottwald | ............... 327/79 |
| 5,249,086 A | * | 9/1993 | Sharma | ............... 360/45 |
| 6,400,627 B1 | * | 6/2002 | Tai | ............... 365/209 |
| 6,545,906 B1 | | 4/2003 | Savtchenko et al. | ........ 365/158 |
| 6,967,366 B1 | * | 11/2005 | Janesky et al. | ............. 257/295 |

OTHER PUBLICATIONS

D.C. Worledge, "Spin flop switching for magnetic random access memory", Applied Physics Letters, vol. 84, No. 22, May 31, 2004, pp. 4559-4561.
Engel et al., "A 4-Mbit toggle MRAM based on a novel bit and switching method", GE-05 Invited MMM-Internmag 2004, pp. 1-5.
D.C. Worledge, "Magnetic phase diagram of two identical coupled nanogmagnets", Applied Physics Letters, vol. 84, No. 15, Apr. 12, 2004, pp. 2847-2849.
Akerman et al., Chapter 5, "Magnetic tunnel junction based on magnetoresistive random access memory",.Magnetoelectronics 2004.

* cited by examiner

*Primary Examiner*—Andrew Q. Tran
(74) *Attorney, Agent, or Firm*—Ingrassia Fisher & Lorenz (57) ABSTRACT

A method is provided for testing magnetic bits (3, 104, 514) of an array. A train of first (702), second (704), and third (706) pulses is provided to a desired bit, the first and second pulses beginning at a substantially similar low field and increasing in similar amounts with respect to successive trains of the first, second, and third pulses, the third pulse having a current amplitude sufficient to toggle the magnetic bit. A representative count is recorded in response to switching of the bit. The above steps are repeated and a determination is made of the current amplitude required to write and toggle the bit.

20 Claims, 6 Drawing Sheets

| 1ST AND 2ND PULSE CURRENT AMPLITUDE | 1ST PULSE | 2ND PULSE | 3RD PULSE | SWITCHING COUNTS |
|---|---|---|---|---|
| LOW | - | - | TOGGLE | 500 |
| MEDIUM | DIRECT WRITE | | TOGGLE | 1000 |
| HIGH | TOGGLE | TOGGLE | TOGGLE | 1500 |

TRIPLE PULSE METHOD FOR MRAM TOGGLE BIT CHARACTERIZATION

FIELD OF THE INVENTION

The present invention generally relates to testing of semiconductor integrated circuits and more particularly to testing magnetoresistive random access memories.

BACKGROUND OF THE INVENTION

Memories comprise one of the largest markets for semiconductor integrated circuits. In general, a memory is a storage device that retains information or data that can be output when needed. Memory devices are often characterized under such names as high speed, high density, or non-volatile memories. A high speed memory, as its name implies, is a device having extremely fast read/write times that are useful in situations where data transfer rates are critical. A high density memory has a substantial memory size for large storage capability. The most common high density solid state memory is a dynamic random access memory (DRAM). A non-volatile memory is a memory that retains information even when power is removed and is thereby a permanent storage medium. A common non-volatile memory is FLASH memory. In general, an ideal memory has characteristics of all of the above mentioned types of memory.

As mentioned previously, the most widely used non-volatile memory is FLASH memory. FLASH memory uses charge storage in a floating gate to retain information. FLASH memories operate at relatively high voltages, running counter to the trend of reducing power supply voltages for other high density integrated circuits. Moreover, they have slow program and erase times. The ability to write or store charge in the floating gate is limited to a finite number of times that can be exceeded depending on the application. Memory failure occurs if the maximum number of writes is exceeded. FLASH memory is presently limited for high density applications because it cannot be continually scaled to smaller dimensions due to gate oxide limitations.

Another type of non-volatile memory is a magnetoresistive random access memory (MRAM). MRAM is a viable memory type because it is a high density memory, is scalable, requires low voltage, and has low power consumption and high speed read/write times. A magnetoresistive memory cell comprises a magnetic tunnel junction (MJT) and includes ferromagnetic layers separated by an insulating dielectric. Electrons tunnel through the dielectric, known as a tunnel barrier, from a first ferromagnetic layer to a second ferromagnetic layer. The direction of the magnetization vectors in the ferromagnetic layers determines the tunneling resistance. A zero logic state is represented when the magnetization directions are parallel which corresponds to a low tunneling resistance for the magnetic tunneling junction. Conversely, a one logic state is represented when the magnetization states are anti-parallel which corresponds to a high tunneling resistance. Typically, a magnetic vector in a first magnetic layer is fixed or pinned, while the magnetization direction of a second magnetic layer is free to switch between the same and opposite (anti-parallel) directions. The memory is non-volatile because the ferromagnetic material holds the magnetization vectors when the memory is not powered. It should be noted that the selection of the parallel state or the anti-parallel state as a logic one or zero state is arbitrary.

In a common MRAM architecture, each memory cell of an array of memory cells is located at the intersections of an orthogonal array of conductive lines. A bit line is generally associated with each column of an array of MRAM cells and a digit line is associated with each row of MRAM cells in the array. In general, programming or writing to a selected cell is accomplished by passing predetermined currents through the digit and bit lines intersecting at the selected cell. The currents create a magnetic field that sets the magnetic vector in the free layer to a desired position. Reading the state of a MRAM cell is accomplished by detecting a resistance of the magnetic tunnel junction. For example, the MRAM cell is biased at a predetermined voltage, the magnitude of the current through the MRAM cell corresponds to the resistance value of the device. Thus, the two different resistive values of the MRAM cell that directly relates to a stored parallel or anti-parallel magnetization vector can be converted to a corresponding digital logic level.

In general, MRAM cells are formed in a CMOS wafer process. In many MRAM architectures, each memory cell comprises an MTJ bit and at least one CMOS transistor coupled in series. In development and production manufacturing, it is beneficial to be able to rapidly characterize and optimize memory cells without using the supporting CMOS circuitry. This is especially true when the goal is the characterization of the MRAM cell itself and not other circuitry associated with the memory. The cost to process wafers to a finished level is expensive because of the number of masks and wafer processing steps used in a complex CMOS wafer process flow. Moreover, in the development phase, different materials or different cell structures are routinely produced that if processed using the entire process flow would have substantial manufacturing cycle time. Long term, it is beneficial to have the capability to perform on chip testing of MRAM cells during wafer processing and at wafer probe to generate insitu processing data without the need for the full CMOS circuitry associated with the finished MRAM circuit.

Accordingly, it is desirable to provide a method for characterizing a magnetoresistive random access memory array. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

FIG. 4 is a graph illustrating the timing diagram of the bit current and the digit current when both are turned on;

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

A typical architecture of a magnetoresistive random access memory (MRAM) comprises an array of magnetic tunnel junction (MTJ) bits and CMOS circuitry to read and write to the memory array. Each MTJ bit is located at a unique intersection of a particular bit line and digit line in the memory array. The bit lines and digit lines respectively correspond to column and row lines of more common memory types. Programming of a MTJ cell is achieved by passing current pulses through the bit line and the digit line that intersect at the MTJ cell. The magnetic fields generated by the current pulses in the bit line and the digit line are coupled to a free magnetic layer of the MTJ cell and are designed to have a sufficient magnitude to program the magnetic vector stored therein. The current magnitudes are selected such that a pulse on only one of the lines (bit line or digit line) does not have the magnitude to program the selected MTJ cell nor any other bits coupled to the active bit or digit line. In this example architecture, the digit line does not electrically couple to the MTJ cell but is positioned in a manner where it is only magnetically coupled when it carries a current pulse. The polarity of the current pulses provided to the bit line and the digit line, or the timed sequence of pulses in the bit line and digit line, determine the direction in which the magnetic vector is programmed in the free magnetic layer of the MTJ cell. In general, a transistor is electrically coupled to the MTJ cell. In this example architecture, the transistor is an n-channel field effect transistor. An interconnect stack connects the transistor to the device, which is coupled to the bit line to create the electrical path for reading the resistance of the bit.

The logic state stored in a MTJ cell corresponds to the resistance of the MTJ cell. The resistance is a function of the magnetization direction of the free magnetic layer with respect to the magnetization direction of the fixed magnetic layer. The MTJ cell is in a logic zero state when the magnetization directions are the same (or parallel). Conversely, the MTJ cell is in a logic one state when the magnetization directions oppose one another (anti-parallel). In general, to perform a read on the MTJ cell, the MTJ cell is biased with a predetermined voltage. The bias voltage generates a current through the MTJ cell that corresponds to the resistance of the MTJ cell. The current received from the MTJ cell is then converted to a voltage logic state.

In development, it is very beneficial to have the capability to rapidly manufacture and evaluate test chips. In particular, memory cell arrays often go through many manufacturing iterations because the driving force to reduce memory cell size often results in wafer processing tolerances being pushed to the limit. Due to the nature of MRAM, it is possible to evaluate the magnetic and electrical properties of the individual bits without having to build them on fully processed and costly CMOS wafers. Therefore, in the development of MRAM, the cost is greatly increased, and perhaps more important, time wasted when manufacturing MRAM test chips that include all the peripheral CMOS circuitry used in the device.

Providing the capability to rapidly process and assess MTJ cells to optimize a wafer process or magnetic material properties can greatly reduce the time to market. The ability to rapidly test MTJ cells is not only useful in a development environment but also in a manufacturing environment. It is beneficial to be able to take measurements on MTJ cells during wafer processing and upon completion of wafer processing in wafer form (before dicing). The status of the wafer processing could be determined and corrected or terminated before all the expense has been incurred should it be found out of specification.

An important aspect of characterizing the magnetic device is measuring its response to high-speed current pulses similar to the conditions it would experience in the full memory array. The typical test sequence in an actual memory array with CMOS drivers comprises pulsing every bit in the array using the bit and digit lines with the read transistors disabled. Each bit is then read by enabling the corresponding read transistor of the cell to determine if the cell switched state. Reading individual cells can be performed at megahertz speeds because the read circuitry is local to the corresponding memory cell. In performing high-speed testing on a full MRAM circuit, a statistically significant number of switching events can be performed in a short span of time by switching and reading thousands or millions of bits at chip operating speeds.

There are several drawbacks to relying on full memory arrays to gather high-speed switching statistics. As previously mentioned, fully processed CMOS wafers are expensive and take a significant time to wafer process. Relying on fully processed CMOS wafers may be cost and time prohibitive if it is necessary to quickly evaluate many different materials or varying process conditions. Also, complete MRAM arrays may be restricted in the waveform, timing, amplitude, or other important variables related to the pulse stimuli being evaluated. In addition, the CMOS circuitry itself can introduce errors and additional failure modes, making it difficult to determine the quality of the memory cell alone. Furthermore, memory test systems are expensive and difficult to maintain and they require specific knowledge to program or configure for specialized experiments.

It is for these reasons that it is beneficial to have the capability to generate statistically significant high-speed MTJ switching data on wafers processed with only a few masking steps. However, since there is no CMOS addressing available on such wafers, each bit to be tested has electrical contact points that can be contacted by the test equipment. For example, a probe station could be used to couple the electrical contact points of the MTJ cell to test equipment. Test time would be efficiently utilized by maximizing the number of write and read cycles performed on a given bit within a given test period.

Figure 1:
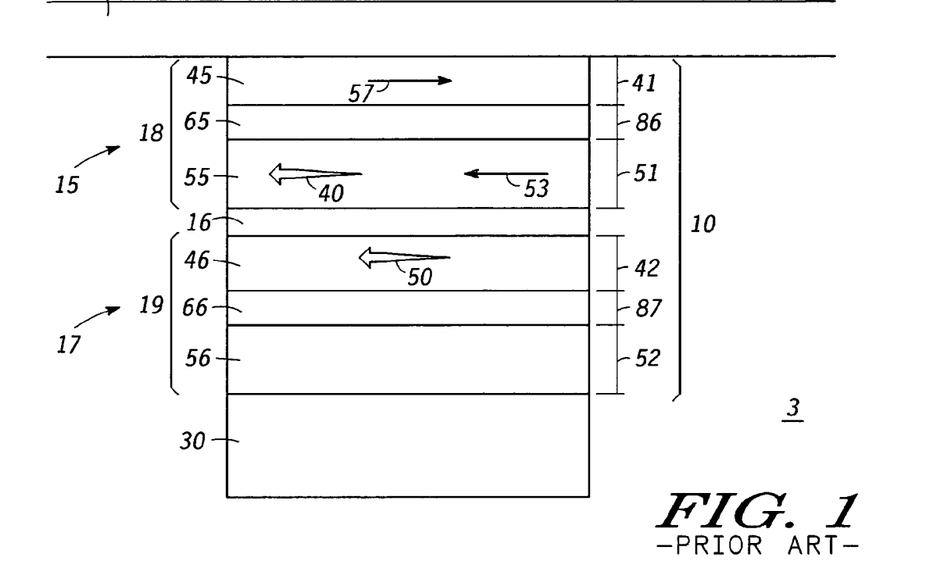
FIG. 1 is a cross-sectional view of a magnetic tunnel junction bit to be characterized in accordance with a preferred embodiment of the present invention.

FIG. 1 is a simplified sectional view of an MRAM array 3 as disclosed in U.S. Pat. No. 6,545,906, issued to Savtchenko et al., that may be characterized in accordance with the present invention. In this illustration, only a single magnetoresistive memory bit 10 is shown, but it will be understood that MRAM array 3 includes a number of MRAM bits 10 and only one such bit is shown for simplicity in describing the writing method. Note that any cell that toggles may be tested using the present invention.

Figure 2:
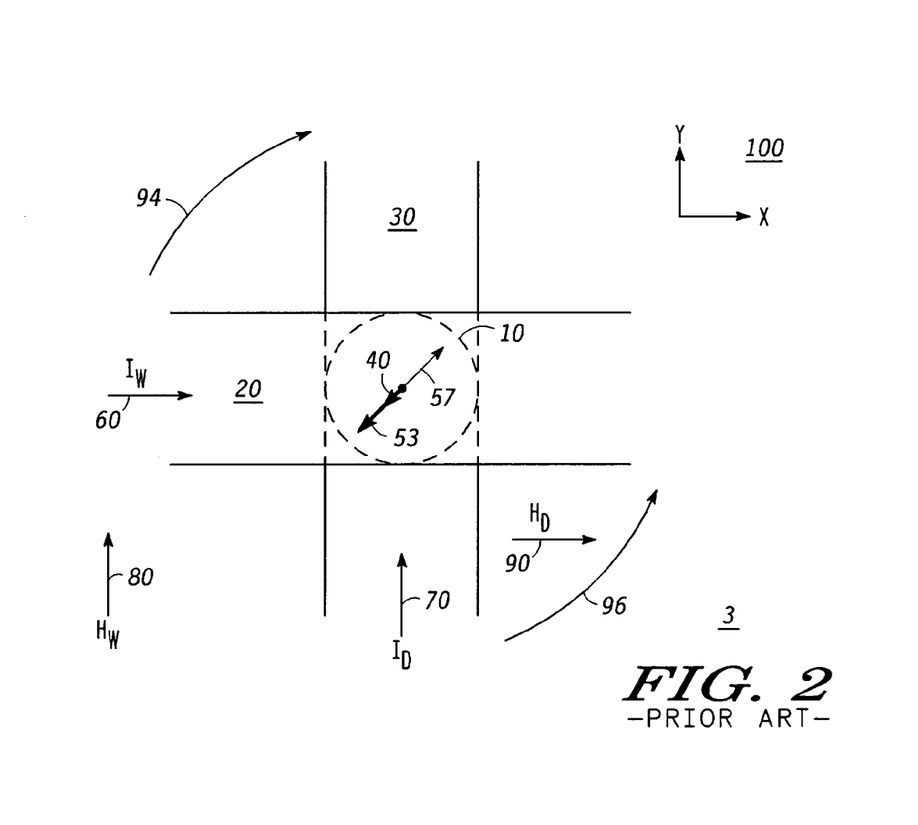
FIG. 2 is a simplified plan view of the magnetic tunnel junction bit of FIG. 1 with bit and digit lines.

MRAM bit 10 is sandwiched therebetween a bit line 20 and a digit line 30. Bit line 20 and digit line 30 include conductive material such that a current can be passed therethrough. In this illustration, bit line 20 is positioned on top of MRAM bit 10 and digit line 30 is positioned on the bottom of MRAM bit 10 and is directed at a 90° angle to bit line 20 as shown in FIG. 2.

MRAM bit 10 includes a first magnetic region 15, a tunneling barrier 16, and a second magnetic region 17, wherein tunneling barrier 16 is sandwiched therebetween first magnetic region 15 and second magnetic region 17. In the exemplary embodiment, magnetic region 15 includes a tri-layer structure 18, which has an anti-ferromagnetic coupling spacer layer 65 sandwiched therebetween two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 sandwiched therebetween two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic layer material structures other than tri-layer structures and the use of tri-layer structures in this embodiment is for illustrative purposes only. For example, one such synthetic anti-ferromagnetic (SAF) layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, for example between 30° to 60°, but preferably 45°, from bit line 20 and digit line 30 (see FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18 and 19, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

MRAM bit 10 has tri-layer structures 18 that have a length/width ratio in a range of 1 to 5 for a non-circular plan. It will be understood that MRAM bit 10 can have various shapes, such as square, elliptical, rectangular, or diamond, but is illustrated in FIG. 2 as being circular for simplicity.

Further, during fabrication of MRAM array 3, each succeeding layer (i.e. 30, 56, 66, 46, 16, 55, 65, etc.) is deposited or otherwise formed in sequence and each MRAM bit 10 may be defined by selective deposition, photolithography processing, etching, etc. in any of the techniques known in the semiconductor industry. During deposition of at least the ferromagnetic layers 45 and 55, a magnetic field may be provided to set a preferred easy magnetic axis for this pair (induced anisotropy). The provided magnetic field creates a preferred anisotropy axis for magnetic moment vectors 53 and 57. The preferred axis is between about 30° and 60°, and more preferably chosen to be at a 45° angle between bit line 20 and digit line 30, as will be discussed presently.

Turn now to FIG. 2, which illustrates a simplified plan view of a MRAM array 3 in accordance with the present invention. To simplify the description of MRAM bit 10, all directions will be referenced to an x- and y-coordinate system 100 as shown and to a clockwise rotation direction 94 and a counter-clockwise rotation direction 96. To further simplify the description, it is again assumed that N is equal to two so that MRAM bit 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed as a way of an example that a anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In the exemplary embodiment, a bit current 60 is defined as being positive if flowing in a positive x-direction and a digit current 70 is defined as being positive if flowing in a positive y-direction. The purpose of bit line 20 and digit line 30 is to create a magnetic field within MRAM bit 10. A positive bit current 60 will induce a circumferential bit magnetic field, $H_W$ 80, and a positive digit current 70 will induce a circumferential digit magnetic field, $H_D$ 90. Since bit line 20 is above MRAM bit 10, in the plane of the element, $H_W$ 80 will be applied to MRAM bit 10 in the positive y-direction for a positive bit current 60. Similarly, since digit line 30 is below MRAM bit 10, in the plane of the element, HD 90 will be applied to MRAM bit 10 in the positive x-direction for a positive digit current 70. It will be understood that the definitions for positive and negative current flow are arbitrary and are defined here for illustrative purposes. The effect of reversing the current flow is to change the direction of the magnetic field induced within MRAM bit 10. The behavior of a current induced magnetic field is well known to those skilled in the art and will not be elaborated upon further here.

Figure 3:
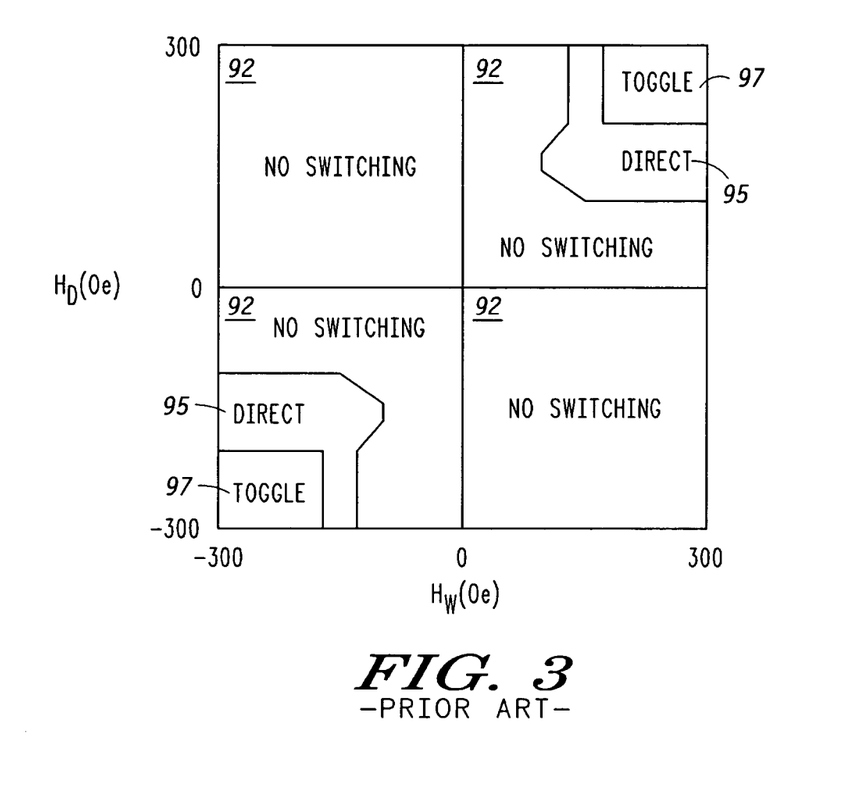
FIG. 3 is a graph illustrating a simulation of the magnetic field amplitude combinations that produce the direct or toggle write mode in the magnetic tunnel junction bit of FIG. 1.
Figure 4:
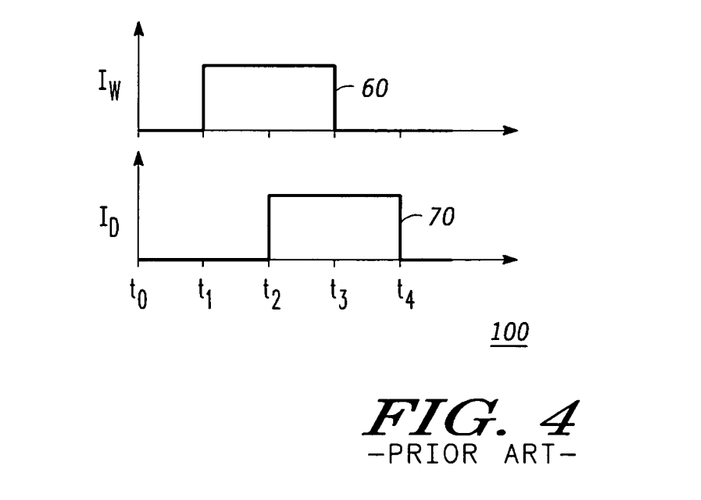

Turn now to FIG. 3, which illustrates the simulated switching behavior of a SAF tri-layer structure. The simulation comprises two single domain magnetic layers that have about the same moment (a nearly balanced SAF) with an intrinsic anisotropy, are coupled anti-ferromagnetically, and whose magnetization dynamics are described by the Landau-Lifshitz equation. The x-axis is the bit line magnetic field amplitude in Oersteds, and the y-axis is the digit line magnetic field amplitude in Oersteds. The magnetic fields are applied in a pulse sequence 100 as shown in FIG. 4 wherein pulse sequence 100 includes bit current 60 and digit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both bit line 20 and digit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM bit will be a '1'. Similar results are obtained when writing a '0' by using negative currents in both the bit and digit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM bit before writing because the state is switched every time the MRAM bit is written to, regardless of the direction of the currents as long as the same polarity current pulses are chosen for both bit line 20 and digit line 30. For example, if a '1' is initially stored then the state of the device will be switched to a '0' after one positive current pulse sequence is flowed through the bit and digit lines. Repeating the positive current pulse sequence on the stored '0' state returns it to a '1'. Thus, to be able to write the memory element into the desired state, the initial state of MRAM bit 10 must first be read and compared to the state to be written. The reading and comparing may require additional logic circuitry, including a buffer for storing information and a comparator for comparing memory states. MRAM bit 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode". Both writing methods involve supplying currents in bit line 20 and digit line 30 such that magnetic moment vectors 53 and 57 can be oriented in one of two preferred directions as discussed previously.

Figure 5:
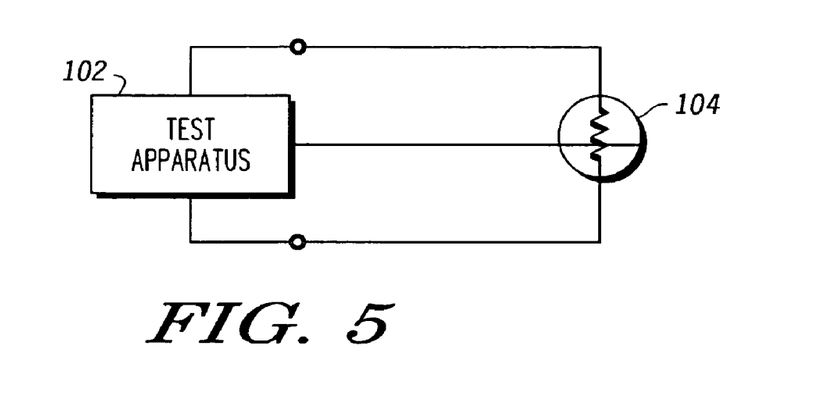
FIG. 5 is a simplified diagram of a test apparatus in accordance with an embodiment of the present invention.

FIG. 5 is a simplified diagram of a test apparatus 102 in accordance with a exemplary embodiment of the present invention. Test apparatus 102 has three terminals for coupling to a magnetic tunnel junction (MTJ) bit 104. In one embodiment, test apparatus 102 is coupled or integrated with a probe station. The probe station has at least three probes for contacting magnetic tunneling junctions on a semiconductor wafer which allows rapid testing of the devices. Thus, testing of magnetic tunnel junctions can be performed during manufacture or at wafer probe. This is very useful for monitoring the status of the wafer process. Test apparatus 102 can pulse MTJ bit 104 to set the magnetic vector in either direction. Test apparatus 102 also provides a DC voltage bias across MTJ bit 104 to generate a current corresponding to the resistance of the device. The sensed current magnitude is then converted to a logic level. Moreover, MTJ bit 104 can be characterized by varying the test conditions of the cell. Test apparatus 102 includes equipment to monitor conditions that occur at different terminals of MTJ bit 104.

Figure 6:
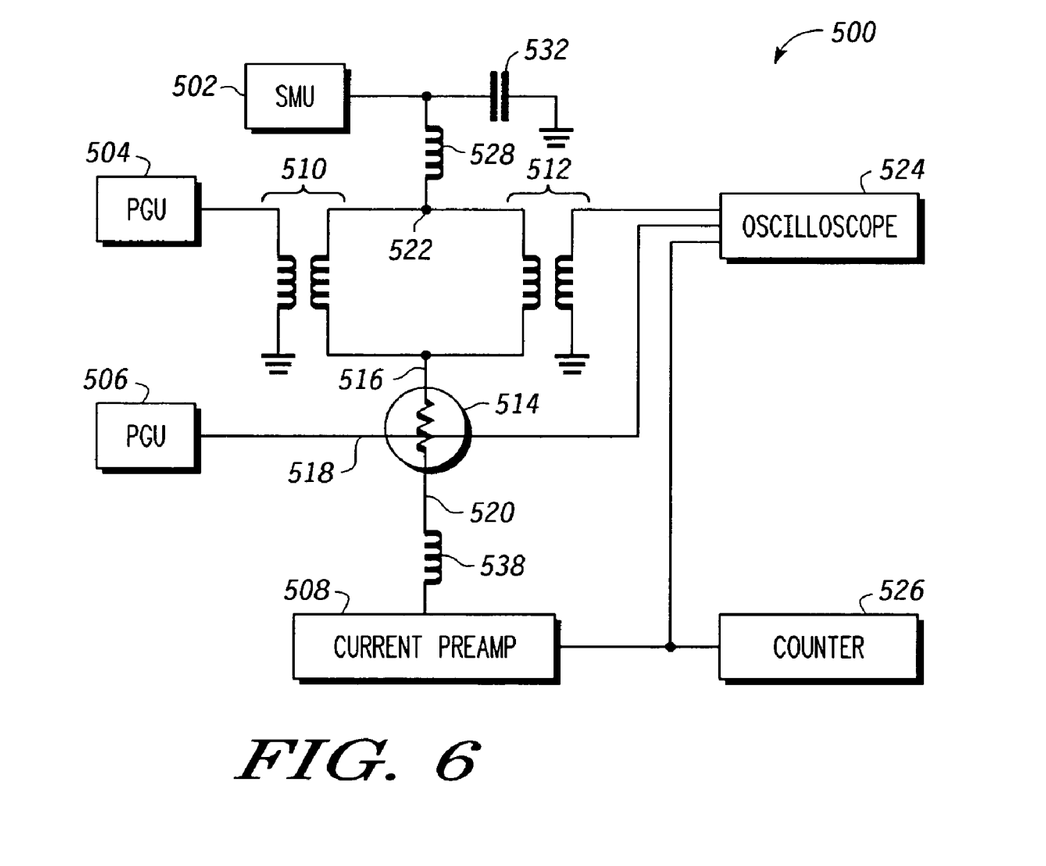
FIG. 6 is a test apparatus in accordance with an embodiment of the present invention.

FIG. 6 is a test apparatus 500 in accordance with the preferred embodiment of the present invention. Test apparatus 500 comprises a source measure unit 502 (SMU), a first pulse generator unit (PGU) 504, a second pulse generator unit (PGU) 506, a current preamp 508, a first transformer 510, and a second transformer 512. A device under test or MTJ cell 514 has a first terminal 516, a second terminal 518, and a third terminal 520. First terminal 516 is coupled to a first magnetic layer of MTJ cell 514. Third terminal 520 is coupled to a second magnetic layer of MTJ cell 514. Second terminal 518 is an interconnect that is in proximity to MTJ cell 514. Second terminal 518 is not electrically coupled to MTJ cell 514 but generates a magnetic field when conducting a current pulse that couples to the free magnetic layer of MTJ cell 514.

First transformer 510 has a first input coupled to the first pulse generator unit 504, a second input coupled to ground, a first output coupled to a node 522, and a second output coupled to terminal 516 of MTJ cell 514. The first and second inputs correspond to a first winding of transformer 510. The first and second outputs correspond to a second winding of transformer 510. Second pulse generator unit 506 has an output coupled to terminal 518 of MTJ cell 514. Current preamp 508 has an input coupled to terminal 520 of MTJ cell 514. Second transformer 512 has a first input coupled to node 522, a second input coupled to terminal 516 of MTJ cell 514, a first output, and a second output coupled to ground. In an embodiment of test apparatus 500, the first output of transformer 512 couples to an oscilloscope 524 for monitoring the test. The first and second inputs of transformer 512 correspond to a first winding of transformer 512. The first and second outputs of transformer 512 correspond to a second winding of transformer 512.

Source measuring unit 502 couples to terminal 516 respectively through the second and first windings of the first and second transformers 510, 512. A DC current path is formed through the following devices: source measuring unit 502, the second winding of transformer 510, the first winding of transformer 512, MTJ cell 514, and current preamp 508. Source measuring unit 502 provides a DC bias voltage on MTJ cell 514. The second and first windings respectively of transformers 510 and 512 is a wire or wired connection coupling the output of source measuring unit 502 to terminal 516. Current preamp 508 acts as a virtual ground to the DC current path. Thus, the DC bias voltage provided by source measuring unit 502 is across MTJ cell 514. The bias voltage provided across MTJ cell 514 by source measuring unit 502 is approximately constant for either stored logic level and under various test operations.

In an embodiment of test apparatus 500, the bias voltage across MTJ cell 514 is provided continuously during both read and write operations. The DC bias voltage across MTJ cell 514 is kept at a voltage level that allows operation such that the sensitive material layers that comprise the magnetic tunneling junction are not compromised during testing. For example, the bias voltage is typically kept at a voltage substantially less than a voltage at which device breakdown occurs. Accordingly, if MTJ cell 514 sustains damage at voltages greater than 2 volts, then the MJT cell 514 would be operated with a bias voltage less than 1 volt, and preferably at approximately 0.5 volts to ensure safe operation of the structure.

Current preamp 508 receives the current corresponding to a logic level stored in MTJ cell 514 and amplifies and converts the current to a detectable signal. In general, current preamp 508 converts current in the microampere range to a voltage signal on the order of hundreds of millivolts. A major benefit of using current preamp 508 is that it increases an operating speed of test apparatus 500. In an alternate embodiment, the bit resistance change would be detected by sensing changes in voltage across the bit at terminal 516 if SMU 502 were in a constant current mode. The time for a voltage change to occur is limited by the RC time constant of the system, where R is the resistance of the bit and C is the capacitance of the interconnects and cabling. For example, a time constant of 2 μs occurs with a resistance of 20 kΩ and a capacitance of 100 pf due to a length of coaxial cable. The maximum operating frequency is approximated using 3 time constants (6 μs) which yields a frequency of 50 kHz or less. By operating SMU 502 in constant voltage, current preamp 508 is used in a mode where the RC time constant of the system is set by the gain resistor R in the preamp and the capacitance C of the preamp. Typical read detection frequencies are in the range of 250 kHz to 500 kHz using a preamp gain of approximately 10 μA/V. Operating current preamp 508 in a constant current mode would greatly slow down a read operation due to capacitive charging. In general, current preamp 508 converts current in the microampere range to a voltage signal on the order of hundreds of millivolts.

In an embodiment of test apparatus 500, an input of a counter 526 is coupled to an output of current preamp 508. A trigger level of counter 526 is set to the midpoint between the voltage outputs of current preamp 508 corresponding to the two different logic levels (low and high resistance states) of MTJ cell 514. A count of counter 526 is incremented when the output of current preamp 508 transitions through the trigger level.

Performance of the circuitry that provides the DC bias voltage to MTJ cell 514 is further enhanced by a first inductor 528, a second inductor 538, and a capacitor 532. In general, an inductor is a short circuit at DC and an open circuit at high frequencies. First inductor 528 has a first terminal coupled to the output of source measuring unit 502 and a second terminal coupled to node 522. First inductor 528 prevents programming pulses provided to MTJ cell 514 from entering or affecting source measuring unit 502. First inductor 528 also prevents electrostatic discharge (ESD) from being coupled from test apparatus 500 to MTJ cell 514. Capacitor 532 has a first terminal coupled to the output of source measuring unit 502 and second terminal coupled to ground. Capacitor 532 is a short circuit to high frequency signals. Capacitor 532 further isolates source measuring unit 502 from disturbances that are generated by changes in MTJ cell 514 during testing. Second inductor 538 has a first terminal coupled to terminal 520 and a second terminal coupled to the input of current preamp 508. Second inductor 538 minimizes spurious current changes that are generated when current pulses pass through terminal 516 and subsequently MJT cell 514. Second inductor 538 also prevents electrostatic discharge from being coupled from test apparatus 500 to MTJ cell 514.

First and second pulse generator units 504, 506 pulse MTJ cell 514 to set a magnetic vector in the free magnetic layer of the device. In particular, pulsing MTJ cell 514 is done in a manner that does not create a damaging voltage across the device. Also, the methodology for pulsing MTJ cell 514 allows MTJ cell to be continuously DC biased. In general, current pulses are provided to terminals 516 and 518 of MTJ cell 514 that generates a magnetic field that is coupled to a free magnetic layer of the device. The combined magnetic field generated by the current pulses has sufficient magnitude to set the magnetic vector of the free magnetic layer.

As mentioned previously, MTJ cell 514 has a DC bias voltage across it provided by source measuring unit 502. The DC bias voltage remains substantially constant during both read and write operations of test apparatus 500. In general, the DC electrical resistance from one coil of a transformer to the other coil of a transformer is treated as an electrical open circuit. Therefore, the DC bias voltage can be continuously provided to MTJ cell 514 during both read and write operations through the second winding of transformer 510 coupled to the first winding of transformer 512 because transformers 510 and 512 isolate the DC bias voltage from the output of PGU 504 and oscilloscope 524. The DC bias voltage is isolated from PGU 504 to prevent interference with the operation of PGU 504. Similarly, the isolation prevents the output resistance of PGU 504 from being read in combination with the resistance of MTJ 514 thereby affecting reading of the stored logic level.

The AC electrical resistance from one coil of a transformer to the other coil of a transformer is treated as an electrical short circuit. A conductive loop comprises the second winding of transformer 510 coupled to the first winding of transformer 512. The conductive loop formed by transformers 510 and 512 is a complete low resistance circuit path that allows a pulse output from pulse generator unit 504 to pass through terminal 516 of MTJ cell 514. The current pulse conducted through terminal 516 generates the magnetic field that couples to the free magnetic layer of MTJ cell 514. The effective resistance parallel to MTJ cell 514 seen by the current pulse is the resistance of the conductive loop which is a low or negligible resistance. Therefore, little or no current of the current pulse is conducted through MTJ cell 514 and the voltage across the device is unchanged. Thus, a large current pulse can be provided to MTJ cell 514 without fear of damaging the sensitive layers of the device. Voltage pulses higher than 6 volts have been applied without damaging the MTJ cell under test using this test configuration. The breakdown voltage of the MTJ cell being tested was 2 volts.

The current pulse provided by the second winding of transformer 510 couples through terminal 516 and the first winding of transformer 512. The first winding of transformer 512 is magnetically coupled to a second winding of transformer 512 which is used to monitor the current pulse. In an embodiment of test apparatus 500, the first and second output of transformer 512 corresponds to the second winding and is respectively coupled to a first input of an oscilloscope 524 and ground. Thus, a pulse from pulse generator unit 504 can be monitored by oscilloscope 524 without direct electrical connection to MTJ cell 514.

Transformers 510 and 512 allow a DC bias to be applied to MTJ cell 514 while simultaneously providing a current pulse for programming the device. As described hereinabove, it can be accomplished without damaging the sensitive structure of a magnetic tunneling junction. The current pulsing is provided at very high speeds which relates to the fast read and write times needed for taking large data samples when characterizing MTJ cell 514. As mentioned previously, the read speed is greatly increased through the use of current preamp 508. The speed of the current pulses used for writing is related to the transformers being used. For example, transformers are typically optimized for operating within a specific frequency band. In an embodiment of test apparatus 500, transformers with a bandpass range from 10 kHz to 400 MHz are used for coupling a current pulse of nanosecond duration that corresponds to a normal operating speed of a memory for testing MTJ cell 514 at speeds exceeding 500 kHz.

Prior art testing would require that the DC bias to MTJ cell 514 be removed before a pulse is provided for programming the device. Removing the DC bias in prior art test configurations prevented interactions between the DC bias and the pulse generator unit. Also, the DC bias and the pulse were problematic because in the prior art configuration the voltages added which could exceed the breakdown limit of the device. Furthermore, switching the DC bias on and off as done in the prior art introduces a delay or settling time to stabilize the test set up which slows down testing or increases the risk of erroneous measurements. All of these limitations are circumvented by test apparatus 500.

Typically, it is useful to test MTJ cell 514 using pulses generated by two programming lines as would be seen in an actual memory array. Pulse generator unit 506 provides a pulse concurrently with pulse generator unit 504. Note that pulse generator unit 506 is not coupled to MTJ cell 514 through a transformer. Terminal 518 of MTJ cell 514 is not electrically coupled to the device. Thus, the pulse provided by pulse generator unit 506 cannot damage MTJ cell 514 and the use of transformers is not necessary. Oscilloscope 524 has a second input coupled to the output of pulse generator unit 506 and a third output coupled to the output of current preamp 508. Oscilloscope 524 or an equivalent monitoring device is useful in tracking/data logging the input stimulus to the device under test, the logic state stored in the device under test, and the programming of the device under test. It should be noted that oscilloscope 524 does not couple to MTJ cell 514 in a manner that degrades testing of the device.

Referring to FIG. 6, the test apparatus is initialized or calibrated prior to high speed testing. MTJ cell 514 is switched between a low and high resistance state using an external magnetic field or by applying large pulses in the current carrying lines. One reason for this preliminary testing is to ensure that the device can store information in either logic state and to set up the test equipment. Current preamp 508 is then offset adjusted such that the output of current preamp 508 is zero volts when MTJ cell 514 is in a high resistance state (low sense current). The current preamp 508 then outputs a voltage magnitude greater than zero volts when the MTJ cell is in a low resistance state (high sense current). The trigger level of counter 526 is then set to a midpoint between the output voltage of current preamp 508 for the high and low resistance states of MTJ cell 514. The line resistance is then calibrated by applying a series of pulses of known amplitude to each current carrying line to MTJ cell 514 and reading the results on oscilloscope 524. In an embodiment of test apparatus 500, the maximum operating speed is determined by current preamp 508. In particular, there must be sufficient delay between writing or resetting of MTJ cell 514 to allow the output of current preamp 508 to swing and settle to the correct logic level such that counter 526 is accurately triggered without errors.

Figure 7:
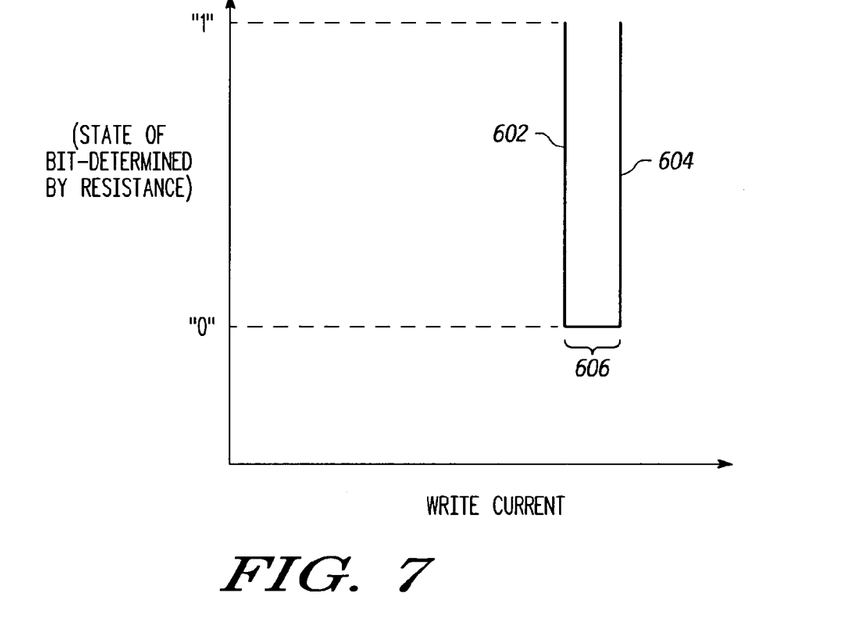
FIG. 7 is a graph showing asymmetry of the programming current between "0" and "1" states.

Referring to FIG. 7, as the write current for the cell 3 of FIG. 1 is increased during repetitive attempts to change the state of the cell, the 0 state may program at a different current than the 1 state due to asymmetry in the bit. The active element when switching MTJ cell 514 is magnetic region 15, which comprises trilayer 18. This region can also be referred to as the magnetic bit. The lower transition of the bit is called the direct write transition 602, while the upper transition 604 is called the toggle transition. The difference between these two switching transitions 606 is called the direct write width. In order to minimize power and maximize switching reliability, the direct write width may be kept at a minimum. A large direct write width may also reflect a defective bit.

Figure 8:
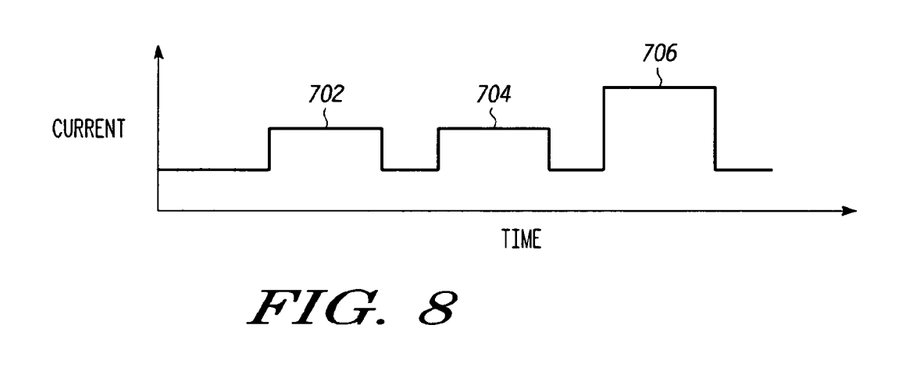
FIG. 8 is a graph showing the triple pulses used in accordance with an embodiment of the present invention.

In accordance with the preferred embodiment of the present invention, FIG. 8 is a graph of a sequence, or train of, triple pulses used for a high speed test of the cell 3 of FIG. 1 using the test apparatus 500 of FIG. 6. This triple pulse technique provides a method for characterizing the high speed switching properties of toggle MRAM cells including both the direct write and toggle transitions. It should be noted that this technique may be used on any toggle cell, not just the embodiment shown in FIG. 1. A large number of triple pulses, for example one thousand (1,000) triple pulse trains, is applied during the test. The first two pulses of each triple pulse train are of substantially equal amplitude, while the third pulse is a high field pulse (i.e., is of an amplitude large enough to toggle the bit). In the preferred embodiment, the polarity of all three pulses is the same. However, the technique will also work with the third pulse polarity opposite to that of the first two pulses. Generally, this triple pulse train is used with a second triple pulse train applied orthogonal to the axis of the field generated by the first triple pulse train. This second triple pulse train usually has all three pulses of amplitude high enough to toggle the bit.

The counter registers a single count as the output voltage of current preamp 508 transitions from one state to other. Most counters can detect transitions of positive slope transitions or negative slope transitions, but not both at the same time. Therefore, in one embodiment, the number of counts registered by counter 526 will equal half the total number of bit transitions.

Figure 9:
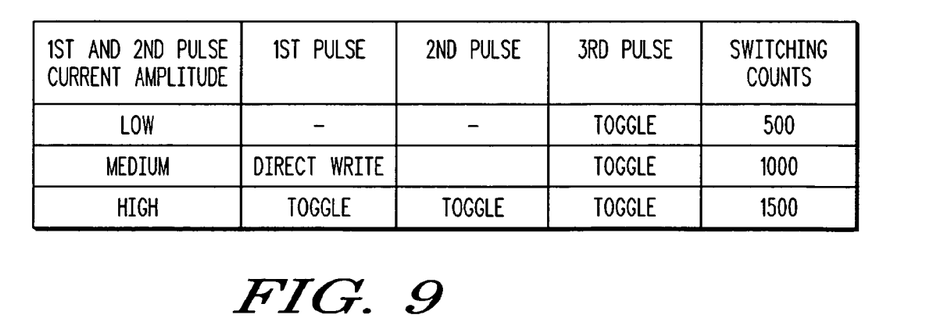
FIG. 9 is a chart showing the effect of the triple pulses of FIG. 8.

Referring to FIG. 9, if the bit cannot be switched by the amplitude of the first two equal amplitude pulses (i.e., pulse current amplitude LOW), then the counter will register only the switches caused by the third larger pulse (which resets the bit). In this instance; the counter will register 500 switching counts for a test sequence using 1,000 triple pulse trains (i.e., 3,000 total pulses). In other words, the number of bit transitions resulting from the third larger pulse of the 1,000 triple pulse trains alone is 1,000. Furthermore, in the embodiment being described, recall that the number of counts registered by counter 526 is equal to half of the total number of bit transitions. If the first two pulses are of an amplitude that the bit can be "directly written" but not toggled (i.e., pulse current amplitude MEDIUM), then the first pulse will switch the bit, the second pulse will do nothing, and the third pulse will switch the bit back to the direct write state. Therefore, for the two thousand bit transitions occurring because of the first pulse and the third pulse of the 1,000 triple pulse trains, one thousand (1,000) switching counts will be registered. If the first two pulses are of amplitude large enough to toggle the bit (i.e., pulse current amplitude HIGH), then one thousand five hundred (1,500) counts will be registered. In other words, for the three thousand bit transitions occurring because of the first pulse, second pulse, and the third pulse of the 1,000 triple pulse trains, one thousand five hundred (1,500) switching counts will be registered.

Figure 10:
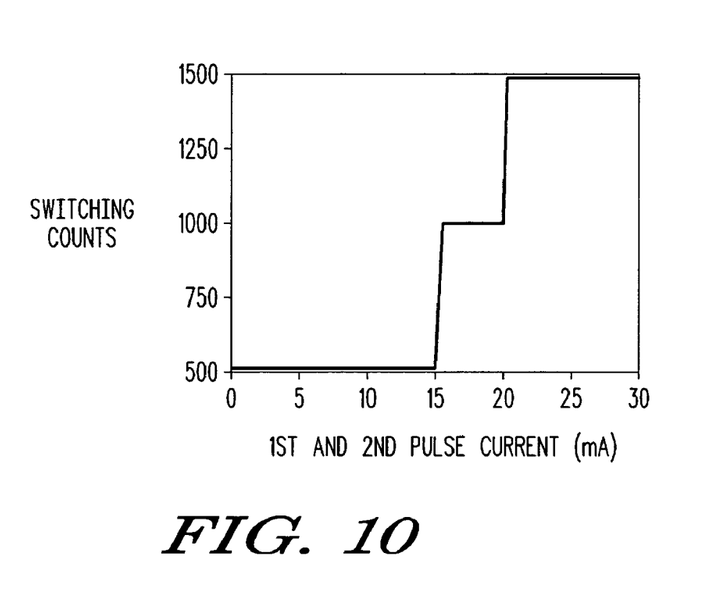
FIG. 10 is a graph of measurements taken by the test apparatus of FIG. 6 corresponding to the number of switching counts of the bit.

Referring to FIG. 10, the graph represents a sweep of switching counts vs. current amplitude for pulses of 20 ns duration as applied to the MTJ bit. In particular, the graph represents a sweep of switching counts for successive one thousand triple pulse trains vs. pulse current amplitude of the first and second pulses, from 0 to 30 mA, as applied to the MTJ bit. Both the direct write and toggle transitions are shown. The bit switching transitions can be fully characterized in a single sweep of the triple pulse trains (over a pulse current amplitude range for the first and second pulses, from 0 to 30 mA) without the need to perform a DC read of the bit state or the need to set the bit in a particular starting state. In one embodiment, the MTJ cell is pulsed at speeds of 500 kHz or more. As the current is increased from just above 0 mA up to about 15 mA, the bit is not written by the first and second pulses (the count of 500 is provided by the third pulse). At about 15 mA, the count jumps to 1000 indicating the first and third pulses are writing the bit (500 switching counts provided by the first pulse plus 500 switching counts provided by the third pulse). Then at about 18 mA, the count jumps to 1500 indicating the first, second, and third pulses are toggling the bit. These readings of 15 mA and 18 mA give the range in which the particular MTJ bit under test may be written. This triple pulse method allows for a much faster characterization of the bit compared to quasistatic external fields and for much larger numbers of switching events to be recorded, thereby generating better statistics. This changing of the switching count from 500 to 1000, and then from 1000 to 1500 indicates the corresponding current amplitude necessary to direct write and toggle, respectively, the bit under test.

Measuring the switching properties of the MRAM cell using high speed current pulses requires electrical contact to the bits as well as digit lines and bit lines as discussed above. Such simple electrical test structures require multiple metal layers and consequently, are somewhat costly and time consuming to fabricate. Therefore, it is also beneficial to characterize the switching properties of the MRAM cell without electrical contact.

It is well-known in the art that the switching properties of large arrays of magnetic bits can be measured without electrical contact by using various magnetometers, such as a vibrating sample magnetometer, an alternating gradient magnetometer, or a magneto-optical magnetometer. Such magnetometers measure the switching properties of the arrays simultaneously, yielding such information as the average switching field and standard deviation of the array. No electrical contact is required, so that typically only a single photo mask is required to pattern the array and measure its properties. The magnetic fields applied to the array are supplied by an external electromagnet so that the field rise and fall time are relatively slow (ms to s). In some cases, unpatterned magnetic material is measured so that no masking steps are required. Using magnetometers to characterize the switching properties of both patterned and unpatterned magnetic materials is the fastest and cheapest method for optimizing the MRAM cell.

Typically, when the MRAM cell operates in toggle mode, the two layers 722 and 724 of the SAF free layer 720 (FIG. 11) are approximately equal and opposite in moment so that magnetometers that operate by detecting magnetic flux from the sample cannot detect any signal. However, an optical magnetometer 730 has the unique advantage of preferentially detecting the magnetization in the top magnetic layer 722 of the SAF 720. The optical signal 732 reflected by the SAF 720 is exponentially attenuated by the metal layers 722, 724, 726 so that the lower layer 724 is not significantly detected.

Figure 11:
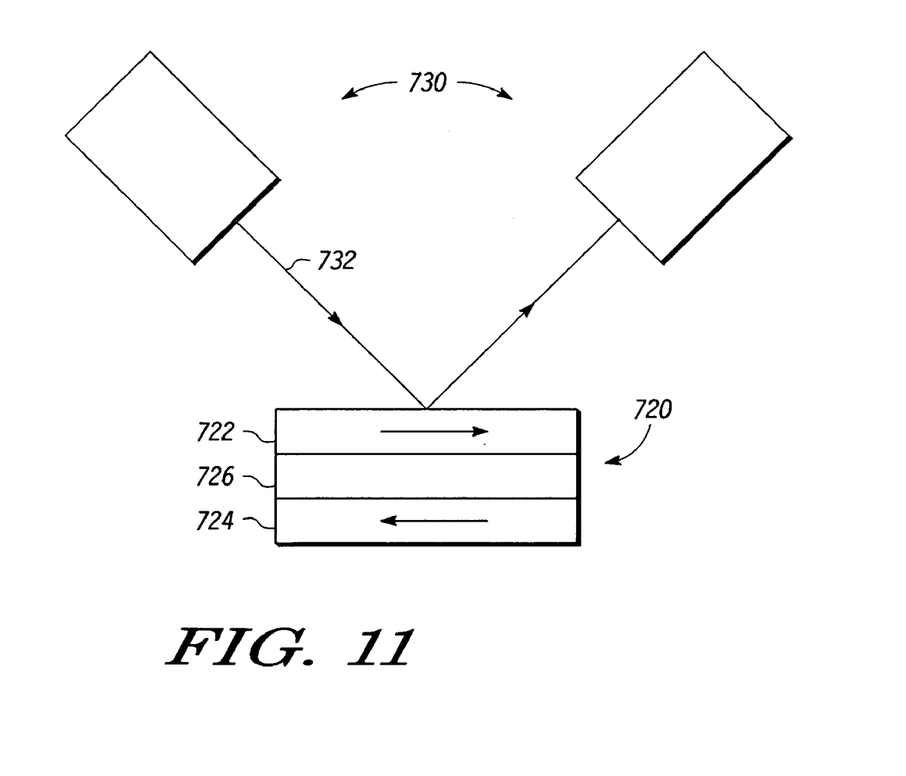
FIG. 11 is an alternate embodiment of accomplishing the switching of the bits and performing the count thereof.
Figure 12:
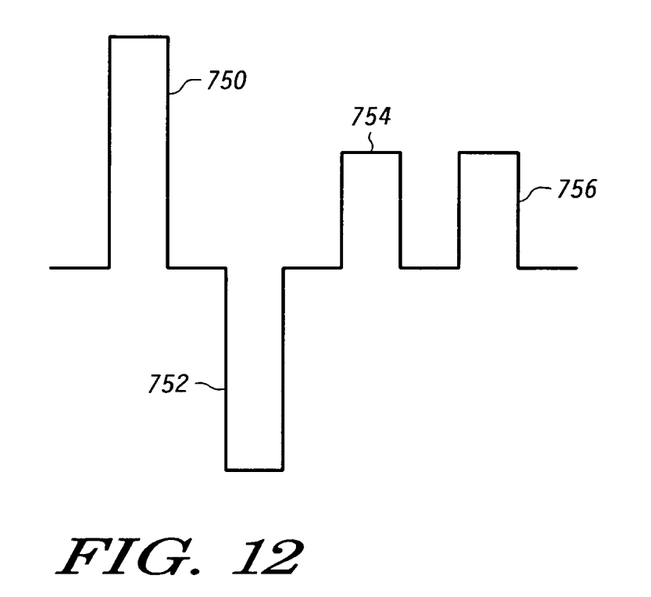
FIG. 12 is a graph showing the pulses used in accordance with the alternate embodiment of FIG. 11.

When using the optical magnetometer 730 to characterize the switching properties of toggle material, it is advantageous to use a pulse field sequence similar to that used in electrical test of individual bits as discussed above. The first pulse 750 as shown in FIG. 12 is a large amplitude pulse intended to switch almost all of the bits so that their top layer 722 lies in the same direction. The second pulse 752 is a large amplitude field pulse in the opposite direction that switches all the bits in the opposite direction. These first two pulses provide the maximum signal amplitude for switching all the bits from one direction to the other. Knowing the maximum amplitude is useful for calibrating the signal change at intermediate fields. In addition, optical magnetometers 730 are prone to drift in signal amplitude so that frequent calibration is necessary for quantitative results. Note that the first pulse 750 of the two large pulses (750,752) is optional. For stable, calibrated, optical magnetometers, only the second pulse 752 would be needed to set the top layers in the same direction. Accordingly, in one embodiment, the second large pulse 752 acts as a reset pulse.

After the large pulses 750, 752, two smaller field pulses 754, 756 of equal amplitude are applied whose polarity is opposite that of the last large reset pulse 752. This three pulse sequence (negative large, positive small, positive small) is the triple pulse embodiment for the optical magnetometer 730. The first small positive pulse 754 will switch bits using the direct write mode and toggle mode. The direct write mode is available because the reset pulse 752 was of the opposite polarity. Recall that in the direct write mode, the field amplitude is such that only bipolar field pulses will switch the bits between the two states. The second small pulse 756 will only switch bits that are capable of toggling at this field amplitude, since by definition, the direct write bits will switch on the first pulse 754, but not on a subsequent pulse of the same amplitude and polarity.

Generally, the triple pulse field is applied at 45 degrees, for example, to the bit easy axis, just as in the electrical triple pulse method discussed above. Also similar to the electrical method, during measurement, a second triple pulse field train is applied whose direction is orthogonal to that of the first triple pulse train and where the amplitude of all pulses of the second triple pulse train are high enough to toggle the bit.

Figure 13:
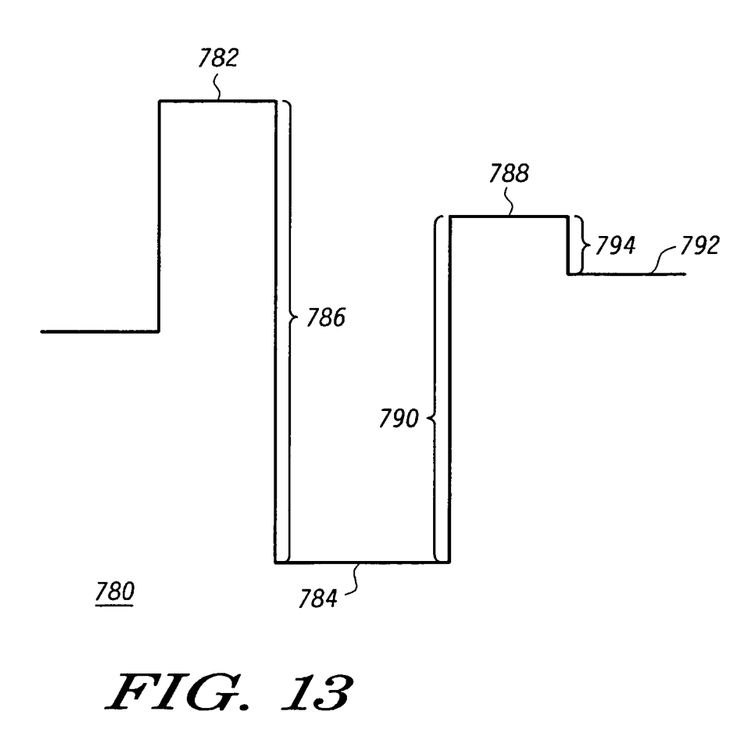
FIG. 13 is a graph showing an optical signal as an example for the triple pulse sequence of FIG. 12.

An example optical signal 780 for such a triple pulse field sequence is shown in FIG. 13. Signal level 782 occurs after field pulse 750. Signal level 784 occurs after field pulse 752. The signal difference between 782 and 784 gives the maximum switching signal 786. Signal level 788 occurs after field pulse 754. The signal difference 790 between the signal level 784 and signal level 788 gives the fraction of the direct write bits. Signal level 792 occurs after field pulse 756. The signal difference 794 between signal level 788 and signal level 792 pulse gives the fraction of the toggle bits. Repeating the sequence for varying amplitude of the last two field pulses 754, 756 gives the switching distribution for the direct write and toggle mode, from which mean switching fields and standard deviations can be derived.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for testing a magnetic bit comprising:
providing first, second, and third field pulses to the magnetic bit, the first and second field pulses having a substantially similar field of a first magnitude, the third pulse being at a high field of a second magnitude different from the first magnitude; and
determining whether the magnetic bit has switched in response to one or more of the first, second, and third field pulses.

2. The method of claim 1 wherein providing the first, second, and third field pulses comprises providing N successive triple pulse trains of first, second, and third field pulses, where N is an integer equal to one or more.

3. The method of claim 2 wherein the first magnitude of the first and second field pulses is increased similarly in incremental amounts with each successive train of first, second, and third field pulses at least until the magnetic bit has switched in response to each of the first, second, and third field pulses of a corresponding triple pulse train.

4. The method of claim 2 wherein N is substantially greater than 1, the method further comprising:
counting a representation of the number of switches of the magnetic bit with each train of field pulses.

5. The method of claim 1 wherein the third field pulse is opposite in polarity to the first and second field pulses and wherein the third field pulse occurs before the first and second field pulses.

6. The method of claim 1 wherein the second magnitude is sufficient to set the magnetic bit in a preferred direction.

7. The method of claim 1 wherein the determining step comprises using a magneto-optical magnetometer to determine whether the magnetic bit has switched.

8. The method of claim 7 further comprising providing a fourth field pulse before the third field pulse, the fourth field pulse being of sufficient magnitude to set the magnetic bit in a preferred direction and being opposite in polarity to the third field pulse.

9. A method for testing a magnetoresistive tunnel junction bit comprising:
providing a train of first, second, and third pulses to the magnetoresistive tunnel junction bit, the first and second pulses having a substantially similar first current amplitude, the third pulse having a second current amplitude sufficient to toggle the magnetoresistive tunnel junction bit; and
counting a representation of the number of switches of the magnetoresistive tunnel junction bit in response to the train of pulses.

10. The method of claim 9 further comprising repeating the train of first, second, and third pulses to the magnetoresistive tunnel junction bit a plurality of times, with the first and second pulses incrementally have increasing current amplitude with each successive train of pulses until one or more of (i) the first pulse toggles the magnetoresistive tunnel junction bit or (ii) the first and second pulses toggle the magnetoresistive tunnel junction bit.

11. The method of claim 10 further comprising determining, in response to the counting, one or more corresponding current amplitude needed to enable the magnetoresistive tunnel junction bit to be directly written or toggled.

12. A method for testing one or more magnetic bits of an array comprising:
providing first, second, and third pulses to one of the magnetic bits, the first and second pulses beginning at a substantially similar field of a first magnitude, the third pulse being at a high field of a second magnitude different from the first magnitude; and
determining whether the magnetic bit has switched in response to one or more of the first, second, and third pulses.

13. The method of claim 12 wherein providing the first, second, and third pulses comprises providing N successive trains of first, second, and third pulses, where N is an integer equal to one or more.

14. The method of claim 13 wherein the first magnitude of the first and second pulses is increased similarly in incremental amounts with each successive train of first, second, and third pulses for the magnetic bit at least until the magnetic bit has switched in response to each of the first, second, and third pulses of a corresponding train.

15. The method of claim 13 wherein N is substantially greater than 1, the method further comprising:
counting a representation of the number of switches of the magnetic bit with each train of pulses.

16. The method of claim 15 wherein the third pulse is opposite in polarity to the first and second pulses and wherein the third pulse occurs before the first and second pulses.

17. The method of claim 15 wherein the second magnitude is sufficient to set the bit in a preferred direction.

18. The method of claim 12 further comprising repeating the providing and determining for a second magnetic bit of the array.

19. The method of claim 12 wherein the determining step comprises using a magneto-optical magnetometer to determine whether the magnetic bit has switched.

20. The method of claim 19 further comprising providing a fourth pulse before the third pulse, the fourth pulse being of sufficient magnitude to set the magnetic bit in a preferred direction and being opposite in polarity to the third pulse.

* * * * *